(12) United States Patent
Li et al.

(10) Patent No.: US 6,996,003 B2
(45) Date of Patent: *Feb. 7, 2006

(54) OPERATING TECHNIQUES FOR REDUCING PROGRAM AND READ DISTURBS OF A NON-VOLATILE MEMORY

(75) Inventors: Yan Li, Milpitas, CA (US); Jian Chen, San Jose, CA (US); Raul-Adrian Cernea, Santa Clara, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/868,728

(22) Filed: Jun. 14, 2004

(65) Prior Publication Data

US 2004/0233750 A1 Nov. 25, 2004

Related U.S. Application Data

(63) Continuation of application No. 10/086,495, filed on Feb. 27, 2002, now Pat. No. 6,771,536.

(51) Int. Cl.
*G11C 16/04* (2006.01)

(52) U.S. Cl. ............................. 365/185.02; 365/185.11; 365/185.18; 365/185.27; 365/185.29

(58) Field of Classification Search ............ 365/185.02, 365/185.11, 185.18, 185.27, 185.29
See application file for complete search history.

(56) References Cited

U.S. PATENT DOCUMENTS 4,962,481 A * 10/1990 Choi et al. ............. 365/185.17
6,072,721 A   6/2000 Arase
6,278,649 B1 * 8/2001 Lee et al. ............... 365/230.03
6,345,000 B1 * 2/2002 Wong et al. ................. 365/185
6,459,623 B1 * 10/2002 Yoshida ................. 365/185.29
6,480,419 B2 * 11/2002 Lee ........................ 365/185.18
6,771,536 B2 * 8/2004 Li et al. ................. 365/185.02

FOREIGN PATENT DOCUMENTS

EP          1 137 012 A2    9/2001

OTHER PUBLICATIONS

Examiner's First Substantive Report, European Patent Application 03 251 165.1 for SanDisk Corporation mailed Sep. 8, 2004.*
Examiner's Second Substantive Report, European Patent Application 03 251 165.1 for SanDisk Corporation mailed Dec. 30, 2004.*
Copy of European Search Report dated Jun. 26, 2003.

* cited by examiner

*Primary Examiner*—Son T. Dinh
(74) *Attorney, Agent, or Firm*—Parsons Hsue & de Runtz LLP

(57) ABSTRACT

The present invention presents a non-volatile memory having a plurality of erase units or blocks, where each block is divided into a plurality of parts sharing the same word lines to save on the row decoder area, but which can be read or programmed independently. An exemplary embodiment is a Flash EEPROM memory with a NAND architecture that has blocks composed of a left half and a right half, where each part will accommodate one or more standard page (data transfer unit) sizes of 512 bytes of data. In the exemplary embodiment, the left and right portions of a block each have separate source lines, and separate sets of source and drain select lines. During the programming or reading of the left side, as an example, the right side can be biased to produce channel boosting to reduce data disturbs. In an alternate set of embodiments, the parts can have separate well structures.

32 Claims, 6 Drawing Sheets

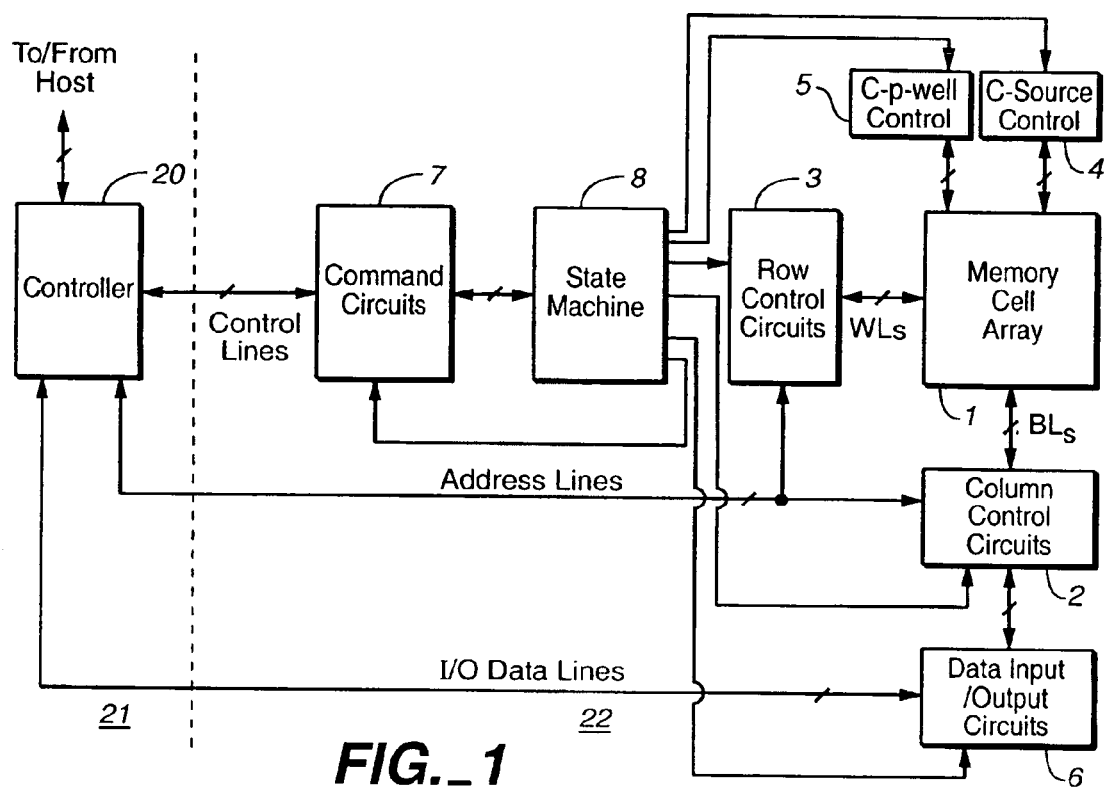
FIG._1
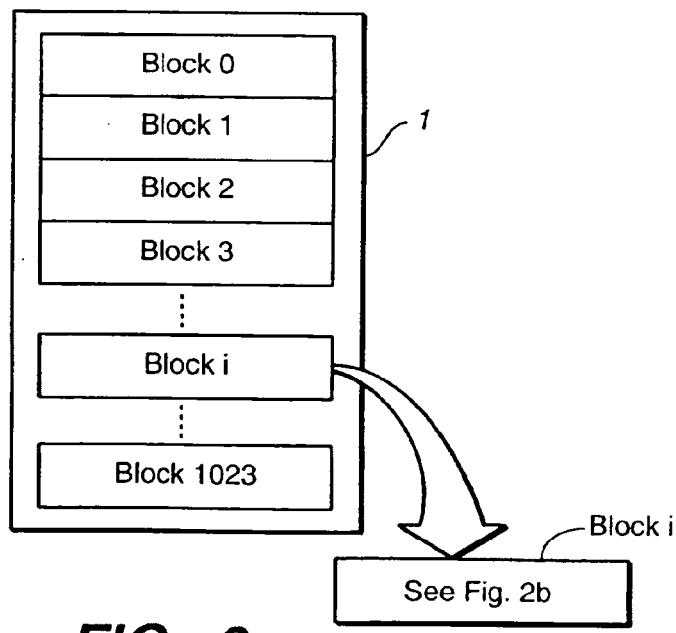
FIG._2a

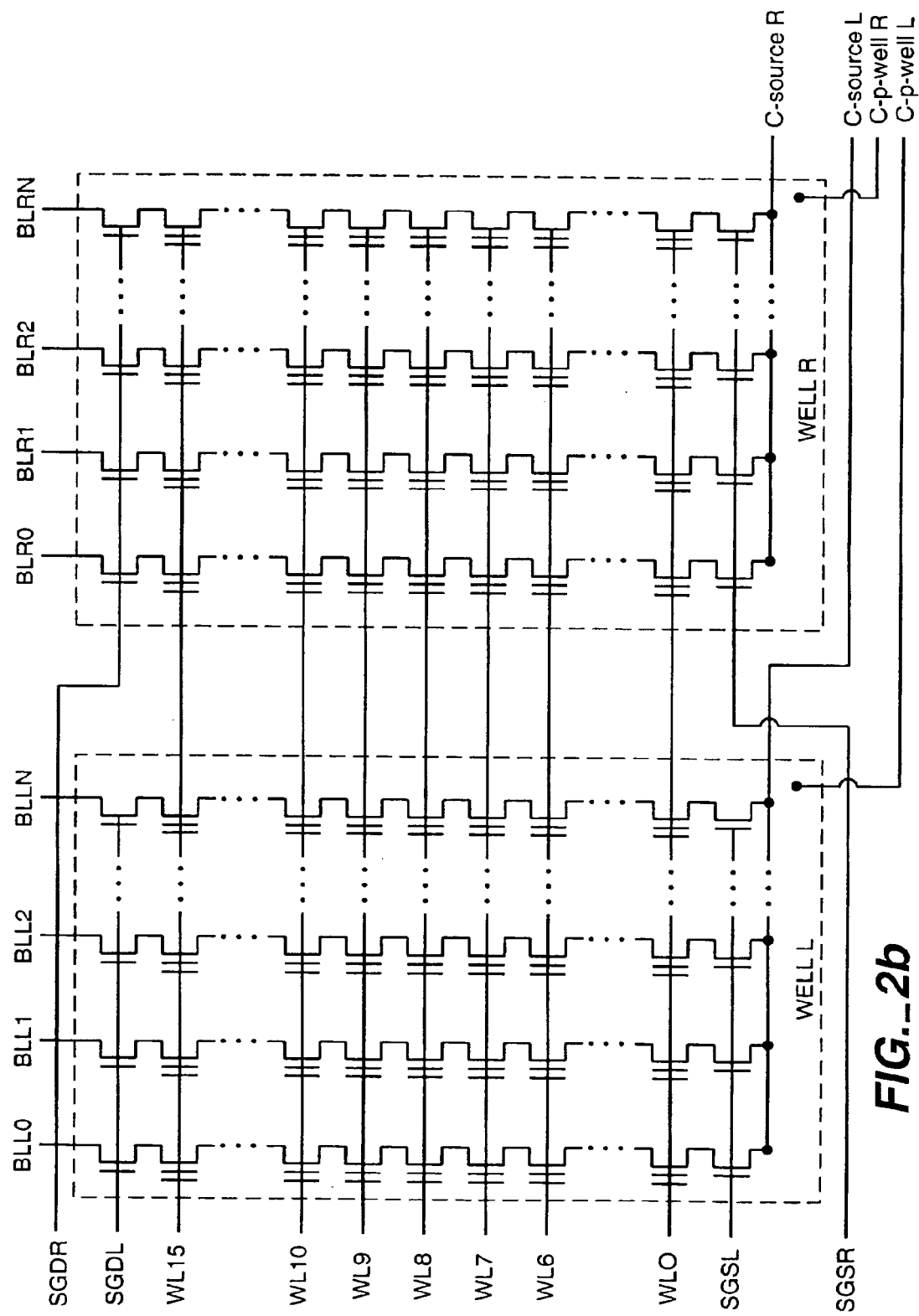
FIG._2b

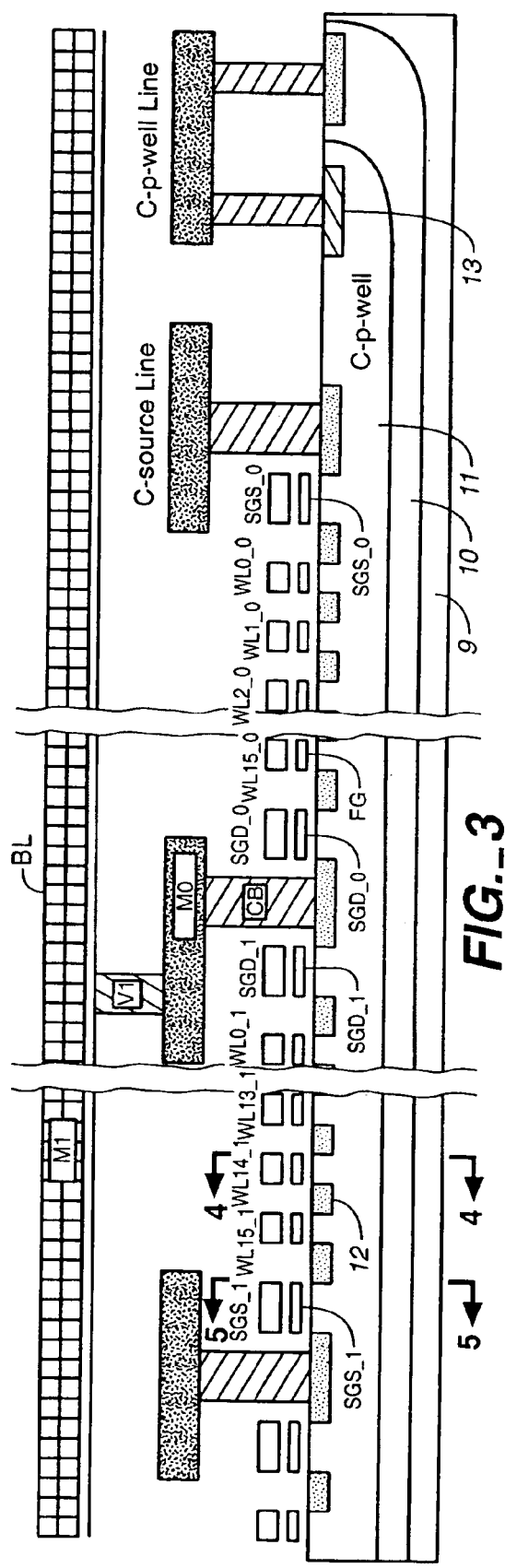
FIG._3
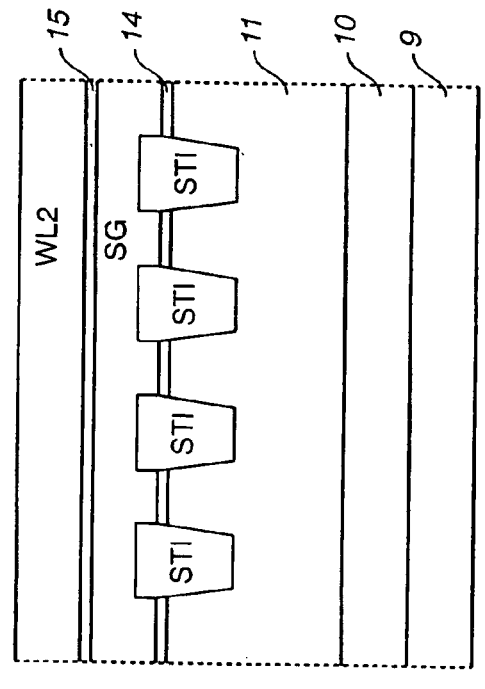
FIG._5
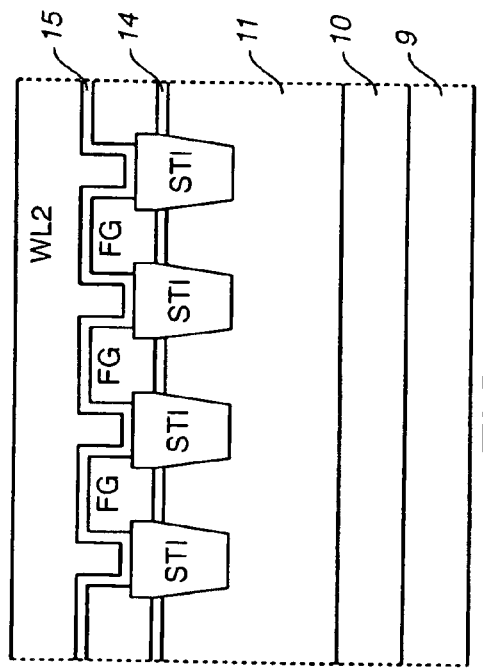
FIG._4

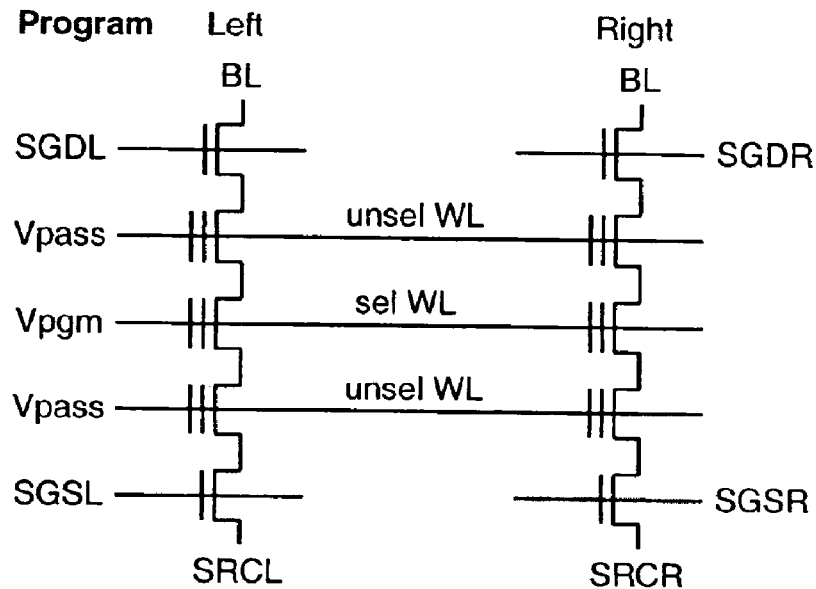
FIG._6a
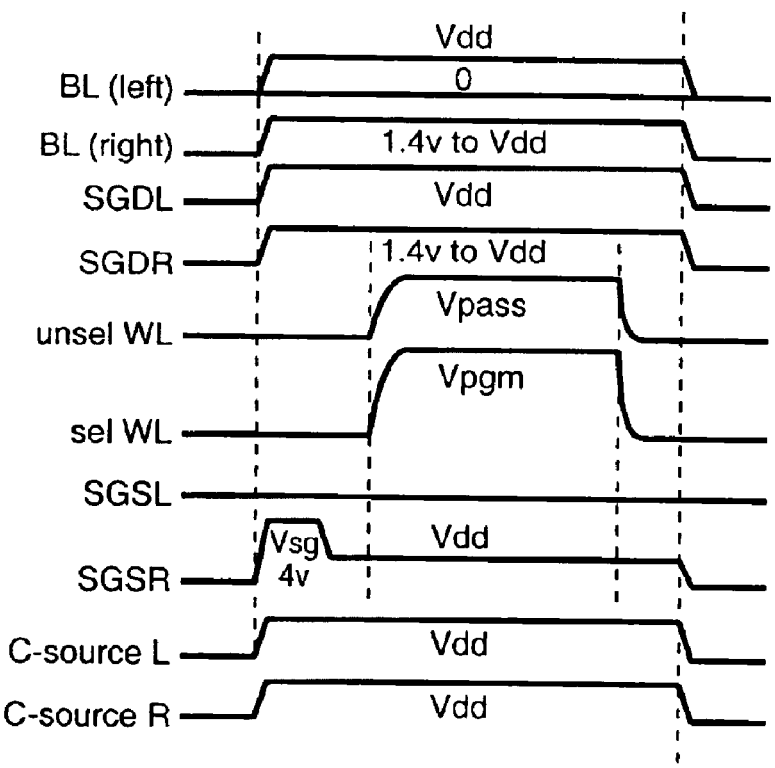
FIG._6b

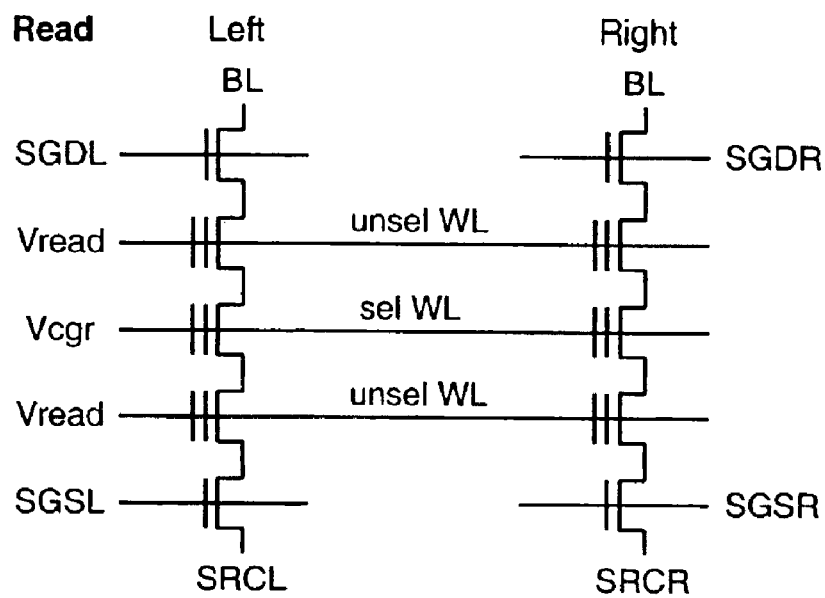
FIG._7a
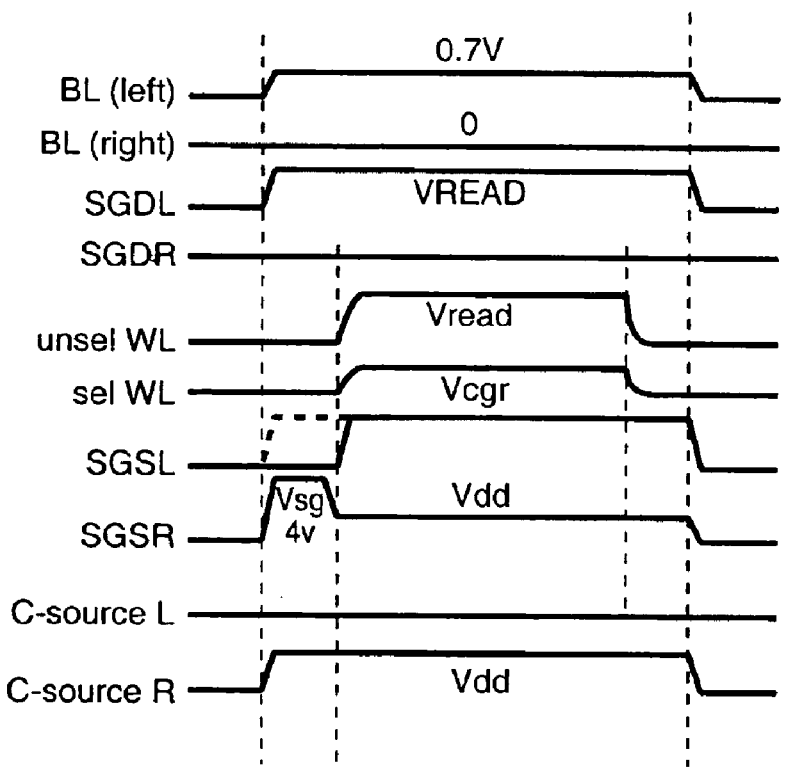
FIG._7b

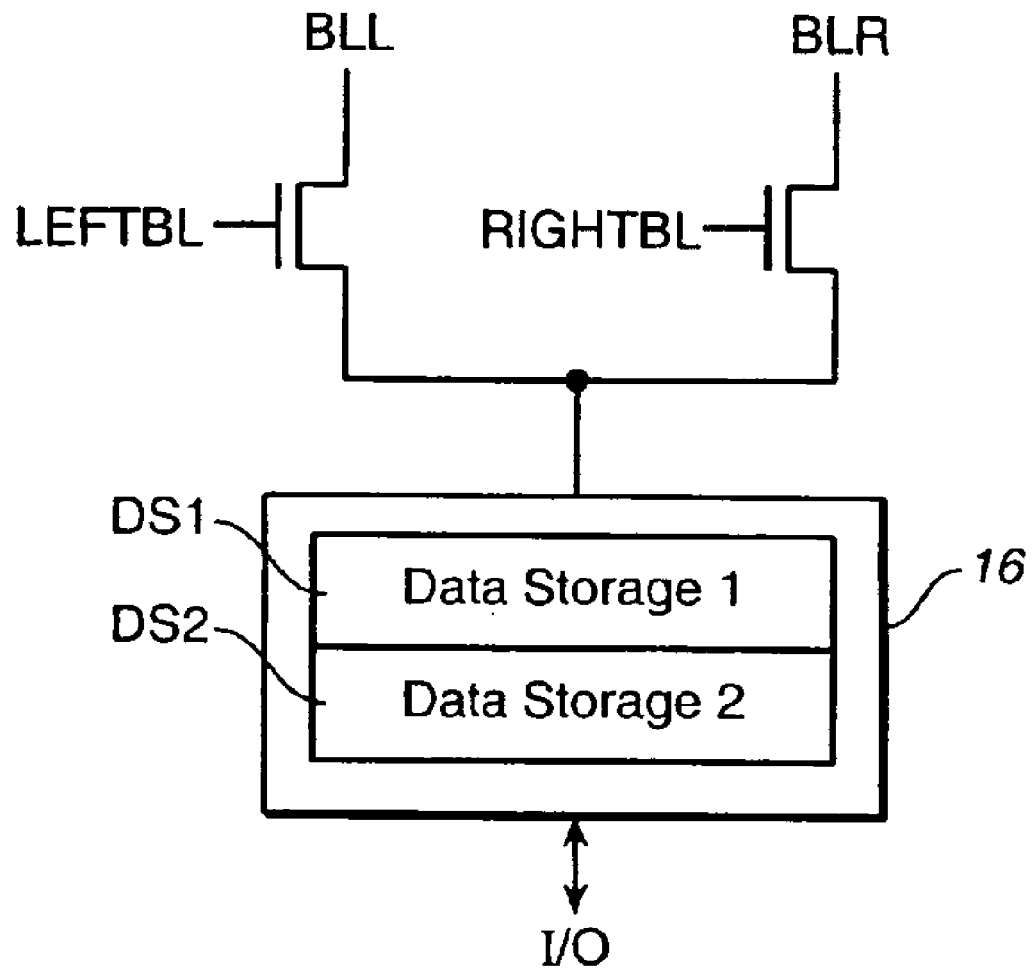
FIG._8

OPERATING TECHNIQUES FOR REDUCING PROGRAM AND READ DISTURBS OF A NON-VOLATILE MEMORY

RELATED APPLICATIONS

This application is a continuation of U.S. patent application Ser. No. 10/086.495, filed Feb. 27, 2002 now U.S. Pat. No. 6,771,536.

FIELD OF THE INVENTION

This invention relates generally to a non-volatile memory and its operation, and, more specifically, to techniques for reducing disturbs during programming and reading operations.

BACKGROUND OF THE INVENTION

The principles of the present invention have application to various types of non-volatile memories, those currently existing and those contemplated to use new technology being developed. Implementations of the present invention, however, are described with respect to a flash electrically-erasable and programmable read-only memory (EEPROM), wherein the storage elements are floating gates.

During the operation of a non-volatile memory, reading and writing of data in one storage unit will often disturb the data stored in other storage units of the memory. One source of these disturbs is the field effect coupling between adjacent floating gates as described in U.S. Pat. No. 5,867,429 of Jian Chen and Yupin Fong, which patent is incorporated herein in its entirety by this reference. The degree of this coupling is necessarily increasing as the sizes of memory cell arrays are being decreased as the result of improvements of integrated circuit manufacturing techniques. The problem occurs most pronouncedly between two sets of adjacent cells that have been programmed at different times. One set of cells is programmed to add a level of charge to their floating gates that corresponds to one set of data. After the second set of cells is programmed with a second set of data, the charge levels read from the floating gates of the first set of cells often appears to be different than programmed because of the effect of the charge on the second set of floating gates being coupled with the first. This is known as the Yupin effect. Aforementioned U.S. Pat. No. 5,867,429 suggests either physically isolating the two sets of floating gates from each other, or taking into account the effect of the charge on the second set of floating gates when reading that of the first. Additional techniques for reducing such disturbs are described in U.S. patent application Ser. No. 09/893,277, filed Jun. 27, 2001, by Jian Chen, Tomoharu Tanaka, Yupin Fong, and Khandker N. Quader and entitled "Operating Techniques for Reducing Effects of Coupling Between Storage Elements of a Non-Volatile Memory Operated in Multiple Data States", which is incorporated herein in its entirety by this reference.

This effect and other sources of read and write disturbs are present in various types of flash EEPROM cell arrays. A NOR array of one design has its memory cells connected between adjacent bit (column) lines and control gates connected to word (row) lines. The individual cells contain either one floating gate transistor, with or without a select transistor formed in series with it, or two floating gate transistors separated by a single select transistor. Examples of such arrays and their use in storage systems are given in the following U.S. patents and pending applications of SanDisk Corporation that are incorporated herein in their entirety by this reference: U.S. Pat. Nos. 5,095,344, 5,172,338, 5,602,987, 5,663,901, 5,430,859, 5,657,332, 5,712,180, 5,890,192, and 6,151,248, and Ser. Nos. 09/505,555, filed Feb. 17, 2000, and 09/667,344, filed Sep. 22, 2000.

A NAND array of one design has a number of memory cells, such as 8, 16 or even 32, connected in series string between a bit line and a reference potential through select transistors at either end. Word lines are connected with control gates of cells in different series strings. Relevant examples of such arrays and their operation are given in the following U.S. patents and pending application of Toshiba that are incorporated herein in their entirety by this reference: U.S. Pat. Nos. 5,570,315, 5,774,397 and 6,046,935, and Ser. No. 09/667,610.

There are different mechanisms that can be used to program EEPROM memory cells. In the references incorporated above, NOR memory cells are commonly programmed by using hot electrons to tunnel through the tunneling oxide to the floating gate, whereas the NAND cells are typically programmed in a Nordheim-Fowler cold tunneling process. An advantage of Nordheim-Fowler tunneling is that it typically uses less power to program a cell; however, it also tends to be more prone to causing disturbs in non-selected cells when the control gate is biased at the high voltage, particularly when selected and non-selected bit-lines share word-lines, as in U.S. patent application Ser. No. 09/893,277 that is incorporated by reference above. The amount of disturb depends on the voltage difference between the control gate and the substrate. In the program case, the control gate is set at a programming of $V_{pgm}$=15–24 volts. In the read process, the voltage of the unselected gates are biased at a lower level, usually 4–5 volts. The effect of the read disturb is much less per read, but a cell experiences more read than programs so that the cumulative effect can still be non-negligible. In a NAND architecture, in both read and program operations the unselected word lines are biased to let the voltage pass to the selected cells in the NAND chains. The unselected cells are connected to unselected word lines biased at the high pass voltages and will consequently be subject to disturbs.

It is still most common in current commercial products for each floating gate to store a single bit of data by operating in a binary mode, where only two ranges of threshold levels of the floating gate transistors are defined as storage levels. The threshold levels of a floating gate transistor correspond to ranges of charge levels stored on their floating gates. In addition to shrinking the size of the memory arrays, the trend is to further increase the density of data storage of such memory arrays by storing more than one bit of data in each floating gate transistor. This is accomplished by defining more than two threshold levels as storage states for each floating gate transistor, four such states (2 bits of data per floating gate) now being included in commercial products. More storage states, such as 16 states per storage element, are contemplated. Each floating gate transistor has a certain total range (window) of threshold voltages in which it may practically be operated, and that range is divided into the number of states defined for it plus margins between the states to allow for them to be clearly differentiated from one another. In a multi-state nonvolatile memory, the threshold voltage ranges are often increased in comparison with single-bit memories in order to accommodate the all of the multi-states and their margins. Correspondingly, the voltages applied to the control gates during read and programming are correspondingly increased, resulting in more program and read disturbs.

A common operation of these types of non-volatile memories is to erase blocks of memory cells prior to reprogramming them. The cells within the block are then individually programmed out of erase into states represented by the incoming data being stored. Programming typically includes alternate application to a large number of memory cells in parallel of programming voltage pulses and a reading of their individual states to determine whether the individual cells have reached their intended levels. Programming is stopped for any cell that is verified to have reached its intended threshold level while programming of the other cells being programmed in parallel continues until all of those cells are programmed. When the number of storage states per storage element is increased, the time to perform the programming will usually be increased since the smaller voltage ranges for the individual states requires a greater precision of programming. This can have a significant adverse impact on the performance of the memory system.

The narrower ranges of the defined floating gate storage levels that result from multi-state operation increases the level of sensitivity of a first group of storage elements to the amount of charge stored on a later programmed second group of adjacent storage elements. When the first group is being read, for example, the charge on the second group can lead to errors in reading the states of the first group. The field coupled from the adjacent memory elements can shift the apparent state being read a sufficient amount to lead to an erroneous read of at least some bits of a group of stored data. If the number of erroneous bits is maintained within the capability of an error correction code (ECC), the errors are corrected but if the number of errors is typically larger than that, some other structural and/or operating technique(s) needs to be employed. The techniques described in aforementioned U.S. Pat. No. 5,867,429 are suitable for many arrays but it is desired to provide additional techniques to compensate for the read and write disturbs in non-volatile memories.

SUMMARY OF THE INVENTION

The present invention presents a non-volatile memory having a plurality of erase units or blocks, where each block is divided into a plurality of parts sharing the same word lines to save on the row decoder area, but which can be read or programmed independently. An exemplary embodiment has blocks composed of a left half and a right half, where each part will accommodate one or more standard page (data transfer unit) sizes of 512 bytes of data. In the exemplary embodiment, the left and right portions of a block each have separate source lines, and separate sets of source and drain select lines. During the programming or reading of the left side, as an example, the right side can be biased to produce channel boosting to reduce data disturbs. In an alternate set of embodiments, the parts can have separate well structures.

To reduce the amount of disturb in both read and write processes, the present invention boosts the surface of the channel in the non-selected portion. In a exemplary embodiment, an initial voltage is supplied to the channel, after which select gate transistors will cut off the leakage path and make the channel floating, followed by ramping up the control gate voltage and boosting the substrate channel the subsequent operation. To allow the selected and non-selected portions of a block of the array to be biased independently, each portion has independently controllable select gate transistors and source lines.

Additional aspects, features and advantages of the present invention are included in the following description of exemplary embodiments, which description should be taken in conjunction with the accompanying drawings.

BRIEF DESCRIPTION OF THE DRAWINGS

FIG. 1 is a block diagram of a non-volatile memory system in which the various aspects of the present invention are described to be implemented;

FIGS. 2a and 2b illustrates aspects of the present invention in a circuit and organization of the memory array of FIG. 1 when a NAND type;

FIG. 3 shows a cross-sectional view, along a column, of a NAND type of memory array formed on a semiconductor substrate;

FIG. 4 is a cross-sectional view of the memory array of FIG. 3, taken at section 4—4 thereof;

FIG. 5 is a cross-sectional view of the memory array of FIG. 3, taken at section 5–5 thereof;

FIGS. 6a and 6b show a simplified array and a timing diagram for a programming process.

FIGS. 7a and 7b show a simplified array and a timing diagram for a read process.

FIG. 8 illustrates another feature of the NAND memory cell array of FIGS. 2–5.

DESCRIPTION OF EXEMPLARY EMBODIMENTS

With reference to FIGS. 1–8, a specific non-volatile memory system is described in which the various aspects of the present invention are implemented, in order to provide specific examples. To reduce the amount of disturb in both read and write processes, the present invention boosts the surface of the channel. In a exemplary embodiment, an initial voltage is supplied to the channel, after which select gate transistors will cut off the leakage path and make the channel floating, followed by ramping up the control gate voltage and boosting the substrate channel the subsequent operation. To allow the selected and non-selected portions of a block of the array to be biased independently, each portion has independently controllable select gate transistors and source lines. In a variation, the separate portions may have their own well structures, although this increases the space requirements.

The array can be sub-divided into any number of partitions to accommodate a page size (the unit of data transfer) that is less than the block size (the unit of erase). The page size is typically determined by the host system and is relatively small for convenience. To improve on space utilization, the trend is towards increased block size as this can save on the number of components and their corresponding space requirements. For example, the space needed for row decoders can be saved by using the same word lines for multiple pages. The row is divided into portions based on page size with each portion having separately controllable drain and source select gates and source lines. The well may not be separated to save layout space, although it can also be divided into small partition if the space is allowed to get smaller erase block.

FIG. 1 is a block diagram of a flash memory system. Memory cell array 1 including a plurality of storage units M arranged in a matrix is controlled by a column control circuit 2, a row control circuit 3, a c-source control circuit 4 and a c-p-well control circuit 5. The column control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control circuit 3 is connected to word lines (WL) to select one of the word lines (WL), to apply read voltages, to apply a program voltages combined with the bit line potential levels controlled by the column control circuit 2, and to apply an erase voltage coupled with a voltage of p-type regions (labeled as "c-p-well" 11 in FIG. 3) on which the memory cells (M) are formed. The c-source control circuit 4 controls the common source lines (labeled as "c-source" in FIG. 2b) connected to the memory cells (M). The c-p-well control circuit 5 controls the voltage of the c-p-wells.

The data stored in the memory cells (M) are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 20. Various implementations for sensing that can be used in the data input/output circuit 6 is described in a U.S. patent application entitled "Noise Reduction Technique For Transistors and Small Devices Utilizing an Episodic Agitation" by Nima Mokhlesi, Daniel C. Guterman, and Geoff Gongwer, filed Jan. 18, 2002, which is hereby incorporated by reference.

Command data for controlling the flash memory device are input to a command interface connected to external control lines which are connected with the controller 20. The command data informs the flash memory of what operation is requested. The input command is transferred to a state machine 8 that controls the column control circuit 2, the row control circuit 3, the c-source control circuit 4, the c-p-well control circuit 5 and the data input/output buffer 6. The state machine 8 can output a status data of the flash memory such as READY/BUSY or PASS/FAIL.

The controller 20 is connected or connectable with a host system such as a personal computer, a digital camera, or a personal digital assistant. It is the host which initiates commands, such as to store or read data to or from the memory array 1, and provides or receives such data, respectively. The controller converts such commands into command signals that can be interpreted and executed by the command circuits 7. The controller also typically contains buffer memory for the user data being written to or read from the memory array. A typical memory system includes one integrated circuit chip 21 that includes the controller 20, and one or more integrated circuit chips 22 that each contain a memory array and associated control, input/output and state machine circuits. The trend, of course, is to integrate the memory array and controller circuits of a system together on one or more integrated circuit chips. The memory system may be embedded as part of the host system, or may be included in a memory card that is removably insertable into a mating socket of host systems. Such a card may include the entire memory system, or the controller and memory array, with associated peripheral circuits, may be provided in separate cards.

With reference to FIGS. 2a and 2b, an example structure of the memory cell array 1 is described. A flash EEPROM of a NAND type is described as an example. The memory cells (M) are partitioned into a number of blocks, 1,024 in a specific example. The data stored in each block are simultaneously erased. The block is thus the minimum unit of a number of cells that are simultaneously erasable. In each block, there are N columns, N=8,512 in this example, that are divided into left columns and right columns. The bit lines are also divided into left bit lines (BLL) and right bit lines (BLR). Sixteen memory cells connected to the word lines (WL0 to WL15) at each gate electrode are connected in series to form a NAND cell unit. One terminal of the NAND cell unit is connected to corresponding bit line (BL) via a first select transistor (S) which gate electrode is coupled to a first (Drain) select gate line (SGD), and another terminal is connected to the c-source via a second (Source) select transistor (S) which gate electrode is coupled to a second select gate line (SGS). Although sixteen floating gate transistors are shown to be included in each cell unit, for simplicity, other numbers of transistors, such as 4, 8, or even 32, are used.

The structure of FIG. 2b differs from the array as presented in described in U.S. patent application Ser. No. 09/893,277, filed Jun. 27, 2001, that is incorporated by reference above in that the block has its columns subdivided into left and right halves rather than alternating odd and even bit lines. More generally, there can be more than two such portions, but the partition into two halves will more readily illustrate the main aspects of the present invention. The left and right columns have separate sets of first select gate lines (SGDL and SGSR, respectively) second select gate lines (SGSL and SGSR, respectively). The levels on the left and right select gates can be independently controlled by row control circuit 3 of FIG. 1. The left and right sides also have separate source lines (C-sourceL and C-sourceR, respectively) that can be independently controlled by C-source control circuit 4 of FIG. 1.

In an alternate set of embodiments, the left and right sides may additionally have independent well structures. FIG. 2b also shows the right and left sides of the array each formed over such separate well structures, allowing the voltage levels to be set independently by the c-p-well control circuit 5 of FIG. 1. In a further variation, this could also allow erasure of a sub-block of less than all of the partitions of a block.

When reading or writing data in a selected one of the left and right portions of the block, the introduction of an independently controllable set of select gate lines and source lines (and possibly an independently controllable well) for each portion allows the numbers of disturbs in non-selected portion to be reduced, as described in more detail below. More generally, a block can be constructed of more than two sections each with source lines and sets of select gates so that the non-selected sections in a read or write process can be biased differently than the selected section with which they share word lines in order to reduce disturbs in these non-selected sections. The size of a section (i.e., the number of columns or N value) will be generally based on user preferences in choice of a convenient or standardized "page" size for data transfer between the host and memory system. Allowing a number of sections to share word lines allows them to share row control circuits and, consequently, results in a saving of space in the memory circuit.

Dividing the array of FIG. 2b into left and right halves reduces the capacitive coupling between the bit lines of halves when compared with the interleaved, odd page/even page arrangement described in U.S. patent application Ser. No. 09/893,277. As described there, after an even page was programmed, an odd page is programmed. As each even bit lines was located between a pair of odd bit lines to which it was capacitively coupled, the programming of the odd page can significantly affect the threshold voltages of cells on the even page bit lines. In addition to the improved control that the various aspects of the present invention provides in the separate sections, the physical separation that results from dividing the block into a left and a right half will significantly reduce the capacitive coupling between adjacent pages of the same wordline.

In the exemplary embodiments, the page size is 512 bytes, which is smaller than the cell numbers on the same wordline.

This page size is based on user preference and convention. Allowing the word line size to correspond to more than one page's worth of cells saves the X-decoder (row control circuit 3) space since different pages worth of data can share the decoders.

During a user data read and programming operation, N=4,256 cells (M) are simultaneously selected in this example. The cells (M) selected have the same word line (WL), for example WL2, and the same kind of bit line (BL), for example the left bit lines BLL0 to BLL4255. Therefore, 532 bytes of data can be read or programmed simultaneously. This 532B data simultaneously read or programmed forms a "page" logically. Therefore, one block can store at least eight pages. When each memory cell (M) stores two bits of data, namely a multi-level cell, one block stores 16 pages in the case of two bit per cell storage. In this embodiment, the storage element of each of the memory cells, in this case the floating gate of each of the memory cells, stores two bits of user data.

FIG. 3 shows a cross sectional view of a NAND cell unit of the type shown schematically in FIG. 2b, in the direction of the bit line (BL). At a surface of a p-type semiconductor substrate 9, a p-type region c-p-well 11 is formed, each of the left and right c-p-wells being enclosed by an n-type region 10 to electrically isolate the c-p-wells from the p-type substrate. The n-type region 10 is connected to a c-p-well line made of a first metal M0 via a first contact hole (CB) and an n-type diffusion layer 12. The p-type region c-p-well 11 is also connected to the c-p-well line via the first contact hole (CB) and a p-type diffusion layer 13. The c-p-well line is connected to the c-p-well control circuit 5 (FIG. 1).

The exemplary embodiment uses Flash EEPROM storage units, where each memory cell has a floating gate (FG) that stores an amount of electric charge corresponding to the data being stored in the cell, the word line (WL) forming the gate electrode, and drain and source electrodes made of the p-type diffusion layer 12. The floating gate (FG) is formed on the surface of the c-p-well via a tunnel oxide film (14). The word line (WL) is stacked on the floating gate (FG) via an insulator film (15). The source electrode is connected to the common source line (c-source) made of the first metal (M0) via the second select transistor (S) and the first contact hole (CB). The common source line is connected to the c-source control circuit (4). The drain electrode is connected to the bit line (BL) made of a second metal (M1) via the first select transistor (S), the first contact hole (CB), an intermediate wiring of the first metal (M0) and a second contact hole (V1). The bit line is connected to the column control circuit (2).

FIGS. 4 and 5 show cross sectional views of a memory cell (section 4—4 of FIG. 3) and a select transistor (section 5—5 of FIG. 3), respectively, in the direction of the word line (WL2). Each column is isolated from the neighbor columns by a trench formed in the substrate and filled with isolation material, known as a shallow trench isolation (STI). The floating gates (FG) are isolated from each other by the STI and insulator film 15 and word line (WL). Presently, the space between the floating gates (FG) is going to less than 0.1 um, and a capacitive coupling between the floating gates has been increasing. Since the gate electrode (SG) of the select transistor (S) is formed in the same formation process steps as the floating gate (FG) and word line (WL), it shows a stacked gate structure. These two select gate lines (SG) are shunted at the end of lines.

FIGS. 6 and 7 summarize voltages applied to operate the memory cell array 1. The specific voltage values used on a selected word line in the program and read/verify processes are described more fully in U.S. patent application Ser. No. 09/893,277, filed Jun. 27, 2001, that is incorporated by reference above. The following discussion uses the case where the word line "WL8" and the bit lines of "BLL", corresponding to the left section, are selected for reading and programming. Generally, the reading and programming uses the order beginning with WL0 and continuing to WL15.

In the exemplary embodiment, the left and right sets of memory cells in a block are erased together in the same process. By raising the c-p-well to an erase voltage $V_{ERASE}$ of, for example, 20V and grounding the word lines (WL) of a selected block while the bit lines (BL), select lines (SGDL, SGDR, SGSL, SGSR) and source lines (C-sourceL, C-sourceR) are put in a floating state, the data of the selected block is erased. The word lines (WL) of the unselected blocks, bit lines (BL), select lines (SGDL, SGDR, SGSL, SGSR) and c-source are put in a floating state, these are also raised to almost 20V due to a capacitive coupling with the c-p-wells. Therefore, a strong electric field is applied to only the tunnel oxide films 14 (FIGS. 4 and 5) of the selected memory cells (M), and the data of the selected memory cells are erased as a tunnel current flows across the tunnel oxide film 14. The erased cell can be taken as one of the possible programmed states.

In order to store electrons in the floating gate (FG) during a programming operation, the selected word line WL8 is connected to a program pulse Vpgm and the selected bit lines BLL are grounded. On the other hand, in order to inhibit the program on the memory cells (M) in which programming is not to take place, the corresponding bit lines BLL are connected to $V_{dd}$ of a power supply, for example 3V. The bit lines BLR of the unselected right side are also raised, as described below. The non-adjacent unselected word lines WL0–WL6 and WL10–WL15 are connected to a pass voltage $V_{PASS}$, for example 10V. The first select gate (SGDL) is connected to $V_{dd}$, the high logic level from an external power supply or internally regulated voltage source, and the second select gate (SGSL) is grounded. In one embodiment, the adjacent word lines are also set to $V_{PASS}$. Other embodiments set the adjacent word line on the drain side, WL9, to $V_{pass}$ for an erased area self boost, or sets both adjacent word lines, WL9 and WL7, to ground for a local self boost. As a result, a channel potential of the memory cell (M) that is being programmed is set at 0V. The channel potential in the program inhibition is raised to around 6V as a result of the channel potential being pulled up by the capacitive coupling with the word lines (WL). As explained above, a strong electric field is applied to only the tunnel oxide films 14 of the memory cells (M) during programming, and the tunnel current flows across the tunnel oxide film 14 in the reverse direction compared to the erase increasing the stored charge level. C-sourceL can be set at $V_{dd}$ to help to setup the initial voltage in the channel before boosting.

The introduction of a separate sets of select gates and a separate source line allows the non-selected section to be independently biased to reduce disturbs, which are more likely in a write process than a read process due to the higher voltages involved. Thus, during the programming of the left side, as an example, the right side can be biased in the way that is good for channel boosting will be achieved. A feature of this scheme is to separate the segmentation control SGD and SGS to left sets and right sets, SGDL, SGDR, SDSL, and SDSR. The source lines are also separated into left and right parts, C-sourceL and C-sourceR.

The bit lines and source lines on the non-selected right side (BLR and C-sourceR) are set at or near $V_{dd}$. The source and drain select transistors on the right side are also set at or near $V_{dd}$. The resultant biasing reduces the electric field across the tunnel oxides on the left side. As the SGDR and SGSR are biased to around $V_{dd}$ levels when programming the left side, and the right side bit and source lines are also biased at $V_{dd}$, good boosting will be achieved on the non-selected right side, resulting in less program disturbs. To save energy, the source and bit lines on the program inhibit side (left) can also be left as floating.

FIG. 6b shows the programming process in more detail, where FIG. 6a shows a simplified version of the array of FIG. 2b for reference. The independence of the left and right portions of the array is used in a three-step process for boosting the channel. In the first stage, an initial voltage is supplied to the channel. Then the select transistors SGD and SGS cut off the leakage path to make the channel floating. Third, the control gate voltage is ramped up so that the substrate channel will be boosted for the subsequent operation.

In the program operation, the selected word line (sel WL) is biased to a high program voltage ($V_{PGM}$) and the unselected word line (unsel WL) is biased to passing voltage ($V_{pass}$), where the specific values are discussed more fully in U.S. patent application Ser. No. 09/893,277, filed Jun. 27, 2001, that is incorporated by reference above. In a variation, one or both of the unselected word lines immediately to a word line selected for programming is set to ground, as discussed above.

Assuming the programming page is written into the left half array, the left array will be boosted initially by the bit line (BL) on the drain side: To program the cell, the bit line is set to ground, and the channel voltage will be 0V; to program inhibit the cell, the bit line voltage is pre-charged to $V_{dd}$. This is shown in the top pair of lines (BL(left)) of FIG. 6b, with the flat 0 line corresponding to a the selected case and the Vdd line corresponding to the non-selected case. Thus the boost is only used on the program inhibited NAND-chains. The source side is floating since SGS=0. If we have a mixed data pattern of "0"s and "1"s to program into the left side of the array, the NAND-chains having a cell need to be programmed to a high (here "0") state will have channel voltage of 0. Conversely, the NAND-chains having a cell that does not need programming (here the low or "1" data) will have a boosted channel. Initially, this channel is boosted by being charged up to a value of $V_{dd}-V_{th}$, where $V_{th}$ is the transistors threshold value. As the control gate voltage on the unselected word lines is ramped up, the channel is eventually boosted to $0.7 \times V_{pass} = 7V$ if $V_{pass} = 10V$ and the coupling ratio between control gate and the channel is 70%. Notice the drain side of the inhibited NAND-chain is also floating with BL=$V_{dd}$ and SGDL=$V_{dd}$. This results in the substrate having a strip of the channel boosted to 7V while and the adjacent strip could have channel voltage 0V. The boosted voltages in the different strips exist on the surface inversion layer and are isolated by the Shallow Trench Isolation (STI) region. Alternately, in order to reduce energy consumption, the source and non-selected bit lines in the selected left half array can initially be supplied some voltage to start the boosting, and then the nodes can be left floating.

In the non-selected portions of the array, here the right half array, all of the NAND-chain is boosted. The flexibility of using separate SGD and SGS on the right half allows a more effective boosting sequence. The initial voltage of the channel is charged UP to $V_{dd}$ from the source side by the source line (C-source). SGS is initially raised to high voltage of $V_{SG}$(=4V in this example) to allow the full $V_{dd}$ voltage to pass, and then lowered to $V_{dd}$ to make the source side floating. After the channel is boosted to $V_{dd}$, the word line voltages are raised and Vpass and Vpgm will boost the channel further with these high voltage. On the drain side, the bit line may be only raised to a value lower than $V_{dd}$, for example 1.4 volts, since the bit lines are harder to charged up to high voltages due to the high associated capacitance. To also make the drain-side also floating, the SGDR is biased at the same voltage level with the BL voltage.

In another embodiment, the initial voltage in the channel can be setup from the drain side on the bit line. In this case, the timing sequence will be to charge up BL(right) to $V_{dd}$ and then raise the $V_{SGDR}$ to 4V to let the BL voltage pass to the channel. The SGDR voltage will then be lowered to $V_{dd}$ to leave the bit line side floating. Thus, the roles of BL(right) and SGDL are respectively switched with C-sourceL and SGSR. After the high voltage of $V_{pgm}$ and $V_{pass}$ are applied to the word lines for programming, the channel surface voltages will be self boosted to around 6–8 volts. The decision to charge from the source side or from the drain side can be based upon an evaluation of the parasitic capacitances of the bit lines and the source line. It is generally preferable to charge up the less capacitive side in order to prepare for the boosting. This reversal of the role of the drain and source sides in the non-selected portions of the block can also be used in the read process as described below.

When the Left and Right sides have separate well structures, the c-p well control can apply a constant voltage, such as $V_{dd}$, to the unselected side well (the right side in the example) at the beginning of the write process. At the same time, both drain and source sides of the NAND chains of the non-selected portion should be floating. Then the unselected well will be coupled up to achieve the boosting. A similar sequence applied to both program and read operations.

The value of the programming voltage $V_{PGM}$ can be a series of pulses increasing in magnitude, where once a cell verifies it is inhibited by raising the voltage on the corresponding bit line. More detail on exemplary programming voltages and sequences are given in U.S. patent application Ser. No. 09/893,277, filed Jun. 27, 2001, that is incorporated by reference above. In an exemplary embodiment described there, each storage unit or memory cell can store two bits of data and the bit lines are divided into an odd and an even set. In this way, for cells on a given word line, both the even and odd bit lines can each store two pages of data (an "upper" and a "lower" page). In order to reduce the effects of the capacitive coupling of the gates (Yupin effect), a programming sequence is described there where either the even or odd columns receive a double pass programming, for example the orders (lower even, lower even, upper even, upper even, lower odd, upper odd) or (lower even, upper even, lower odd, upper odd, lower even, upper even), to improve the distribution of threshold voltages in the cell population. In one aspect of the present invention, the right and left parts of the block are now separated so that the capacitive coupling of the gates (Yupin effect) is reduced. In addition to the other described advantages of having separately controllable well structures, source lines and select gate lines in the left and right halves, the separation of the two halves allows a better distribution of threshold values without the second programming pass. For example, if four pages of data are programmed along a word line, the sequence (left lower, left upper, right lower, right upper) can be used to improve program speed performance by eliminating the second pass of, say, left lower and left upper.

In the read and verify operations, the architecture of the present invention also allows for a reduction read disturbs.

In the exemplary two sub-block embodiment, the left side is again selected and sensed (read). The right side is self-boosted in the channel since the NAND-chain is isolated and the channel is be coupled to some percentage of the $V_{READ}$ voltage. This scheme again utilizes the separate sets of selected gate control signals for SGDL, SGDR, SDSL, and SDSR.

In selected left side, the select gates (SGDL and SGSL) and the unselected word lines (WL0–7 and WL9–15) are respectively raised to read pass voltages of $V_{SG}$ and $V_{READ}$, for example 4.5V, to fully turn on the corresponding transistors and make them act as pass gates. The selected word line (WL8) is connected to a voltage a level $V_{CGR}$ which is specified for each read and verify operation in order to determine whether a threshold voltage of the concerned memory cell has reached such level. In this embodiment, the values for $V_{CGR}$ are data dependent, with slightly higher values employed in a verify operation than in the read operation to guarantee the accuracy of the read.

The selected bit lines (BLL) are precharged to a high level, for example 0.7V. If the threshold voltage is higher than the read or verify level $V_{CGR}$, the potential level of the concerned bit line (BLL) maintains the high level, because of the non-conductive memory cell (M). On the other hand, if the threshold voltage is lower than the read or verify level, the potential level of the concerned bit line (BLL) discharges to a low level, for example less than 0.1V, because of the conductive memory cell (M). Further details of the read and verify operations along with exemplary values for $V_{CGR}$ and the other voltages are described in U.S. patent application Ser. No. 09/893,277, incorporated by reference above.

In the non-selected right side, the bit line (BLR), select gate (SGSR, SGDR), and source line (C-sourceR) can be set at ground. For purposes of effective boosting, a preferred embodiment biases SGSR and source line to be at $V_{dd}$ voltage, as described with respect to FIGS. 7a and 7b. When the source line is not partitioned, as SGSR is at Vsg in the read operation while the c-source is same on both sides and held at 0 volts, the channel voltage in all the NAND chains of the non-selected portion will be held at 0 volts, resulting in a higher amount of disturb than when the source lines are distinct.

FIG. 7b shows the sensing process in more detail, where FIG. 7a shows a simplified version of the array of FIG. 2b for reference. As in the program operation, the independence of the left and right portions of the array is again used in a three step process for boosting the channel. In the first stage, an initial voltage is supplied to the channel. Then the select transistors SGD and SGS cut off the leakage path to make the channel floating. Third, the control gate voltage is ramped up so that the substrate channel will be boosted for the subsequent operation.

In the read operation, the selected word line (sel WL) is biased at the read voltage level $V_{cgr}$, here in the range of from 0V to 3V. The unselected WL is biased to $V_{read}$, for example 4–5V, to let the sensing current pass along the NAND chain without much resistance aside from that in the selected storage unit.

In the left half array, where the cells are sensed, the select gates SGDL and SGSL are biased to a read voltage VREAD, here 4 to 5 volts, so that they fully turned on. The bit line BL(left) is precharged to, for example, 0.5 to 0.7 volts. The sensing is performed when the precharged BL voltages then discharged through the NAND chain: the top line in FIG. 7b shows the case when the selected transistor is fully off and no discharging occurs. The left source line is at ground, C-sourceL=0. The waveform for SGSL shows a dotted line, where the voltage rises at the same time as the bit line is pre-charged, in addition to a full line that rises at the same time as the word lines. The solid line is for the option that the NAND-chain is ON while precharging BL(left), while the dotted line is the option that NAND-chain is OFF while precharging BL(left).

In the right array, the cells are not sensed. The channel is again initially boosted to $V_{dd}$ by raising SGSR voltage to $V_{sg}$ in order to pass $V_{dd}$ from the source line C-sourceR=$V_{dd}$ to the channel. The SGDR voltage is subsequently lowered to $V_{dd}$ to make leave the channel floating. On the drain side, SGDR=0V and BL=0V, and this side is also floating. In this bias scheme, the left side channel is then at ground and the right side channel is boosted to 2 to 3 v to reduce the read disturb.

FIG. 8 shows a part of the column control circuit 2 of FIG. 1 for an embodiment where each memory cell stores two bits of data and storage registers each are shared between a left and a right bit line. Each pair of bit lines (BLL and BLR) is coupled to a data storage portion 16 which includes two data storage (DS1 and DS2) registers, each being capable of storing one bit of data. The data storage portion 16 senses the potential level of the selected bit line (BL) during read or verify operation and then stores the data in a binary manner, and controls the bit line voltage in the program operation. The data storage portion 16 is selectively connected to the selected bit line (BL) by selecting one of signals of "LEFTBL" and "RIGHTBL". The data storage portion 16 is also coupled to the I/O line to output the read data and to store the program data. The I/O line is connected to the data input/output buffer 6, as described above with respect to FIG. 1.

Although the arrangement of FIG. 8 where a pair of bit lines shares a set of registers reduces the number of these registers, and consequently the needed space on the memory device, it is often preferable to provide each bit line with its own set of registers. This allows both sides to be programmed together if the user has two pages of data. This scheme improves the performance in the case that the user has a large amount of data to program.

As mentioned above, although the discussion so far has referred mainly to embodiments using a charge storing device, such as floating gate EEPROM or FLASH cells, for the memory device, it can be applied to other embodiments, including DRAMs and SRAMs. As the particulars of how the individual storage elements are read, are written, and store data do not enter into the main aspects of the present invention, the various aspects of the present invention may be applied to other memory types, including, but not limited to, sub 0.1 um transistors, single electron transistors, organic/carbon based nano-transistors, and molecular transistors. For example, NROM and MNOS cells, such as those respectively described in U.S. Pat. No. 5,768,192 of Eitan and U.S. Pat. No. 4,630,086 of Sato et al., or magnetic RAM and FRAM cells, such as those respectively described in U.S. Pat. No. 5,991,193 of Gallagher et al. and U.S. Pat. No. 5,892,706 of Shimizu et al., all of which are hereby incorporated herein by this reference, could also be used.

Although the various aspects of the present invention have been described with respect to specific embodiments, it will be understood that the invention is protected within the full scope of the appended claims.

It is claimed:

1. A non-volatile memory comprising:
a plurality of storage units formed upon a substrate and arranged into a plurality of columns connected along respective bit lines each comprising a number of said storage units connected in series between a first select transistor and a second select transistor, whereby said storage units form a corresponding number of rows and wherein the columns are subdivided into a plurality of distinct subsets;
a number of word lines each connecting the storage elements of a corresponding row; and
biasing circuitry connected to the select transistors whereby the voltage levels on the gates of the first and second select transistors are settable, wherein the voltage level on one of the first and second select transistors in one subset is settable independently of the voltage level on the gates of said one of the first and second select transistors in the other subsets.

2. The non-volatile memory of claim 1, wherein each of said subsets of columns are formed upon a distinct contiguous region of the substrate.

3. The non-volatile memory of claim 2, wherein the regions are each formed upon a corresponding well structure connected to said biasing circuitry whereby the voltage level in the well structure in one region is settable independently of the voltage level in the well structure in the other regions.

4. The non-volatile memory of claim 1, wherein the source side of the bit lines of each subset are connected to a corresponding common source line connected to said biasing circuitry whereby the voltage level on the common source line in one subset is settable independently of the voltage level on the common source line in the other subsets.

5. The non-volatile memory of claim 4, wherein said storage units comprise floating gate memory cells and the word lines are connected to the control gates of the memory cells of the respective row.

6. The non-volatile memory of claim 4, wherein said storage units are multi-state storage units.

7. The non-volatile memory of claim 4, further comprising:
erase circuitry coupled to said plurality of storage units, wherein the number of storage units in said plurality of storage units corresponds to the size of the erase unit of the non-volatile memory.

8. The non-volatile memory of claim 7, wherein the number of columns in each of said subsets is based on the size of the data transfer unit between the non-volatile memory and a host to which it is connectable.

9. The non-volatile memory of claim 1, further comprising:
a read circuit connected to the word lines to set voltages levels thereon in a read process; and
a plurality of sets of one or more read registers connectable to the columns for storing the data content from a storage element in a column to which the register is connected during a read process.

10. The non-volatile memory of claim 9, wherein each column has a respective set of one or more read registers.

11. The non-volatile memory of claim 9, wherein each set of one or more read registers is connectable to a plurality of columns.

12. The non-volatile memory of claim 9, further comprising:
program circuitry connected to the word lines to set voltages levels thereon in a write process; and
a plurality of sets of one or more write registers connectable to the columns for storing the data content to be written in a storage element in a column to which the register is connected during a read process.

13. The non-volatile memory of claim 12, wherein the read registers are the same as the write registers.

14. A method of operating a non-volatile memory, the memory comprising a plurality of storage units formed upon a substrate and arranged into a plurality of columns connected along respective bit lines each comprising a number of said storage units connected in series between a first select transistor and a second select transistor, whereby said storage units form a corresponding number of rows with a respective wordline connecting the storage elements of each row and wherein the columns are subdivided into a plurality of distinct subsets, the method comprising:
setting a voltage level on the drain side of a first bit line in a first of the subsets;
setting voltage levels on the word lines;
setting voltage levels concurrently on the gates of the first and second select transistors in said first and a second of the subsets, wherein the voltage levels on the gates of one of the first and second select transistors in second subset is different than the voltage levels on the gates of said of the first and second select transistors the first subset.

15. The method of claim 14, wherein said setting voltage levels on the drain side of the first bit line and said setting voltage levels on the gates of the select transistors are performed prior to said setting voltage levels on the word lines.

16. The method of claim 15, wherein the method is part of a read process.

17. The method of claim 16, wherein the voltage level on the drain side first bit line is a value in the range of from 0.5 to 0.7 volts, the voltage level on a first of said word lines is data dependent, and the voltage level on the other word lines is a value in the range of from 4 to 5 volts.

18. The method of claim 14, wherein the source side of the columns of first subset are set to ground and the source side of the columns of second subset are set to the high logic level.

19. The method of claim 18, wherein the voltage level on the gate of the drain side select transistors of the first set is set to a value in the range of from 4 to 5 volts, the voltage level on the gate of the drain side select transistors of the second set is set to ground, the voltage level on the gate of the source side select transistors of the first set is set to the high logic level, and the voltage level on the gate of the source side select transistors of the second set is initially set to a value higher than to the high logic level and lowered to the high logic level concurrently with said setting voltage levels on the word lines.

20. The method of claim 19, wherein the voltage level on the drain side of the bit lines in the second subset is set to ground.

21. The method of claim 16, wherein the read process is part of a verify process.

22. The method of claim 15, wherein the method is part of a write process.

23. The method of claim 22, wherein the voltage level on the drain side of the first bit line is set to ground, the voltage level set on a first of said word lines a programming voltage.

24. The method of claim 23, wherein the voltage level on the word lines in the rows non-adjacent to the first wordline is set to a value in the range of from 8 to 12 volts.

25. The method of claim 24, wherein the voltage level on the word lines in the rows adjacent to the first wordline is set to a value in the range of from 8 to 12 volts.

26. The method of claim 24, wherein the voltage level on the word line in a first row adjacent to the first wordline is set to a value in the range of from 8 to 12 volts and the voltage level on the word line in the second row adjacent to the first wordline is set to ground.

27. The method of claim 25, wherein the voltage level on the word lines in the rows adjacent to the first wordline are set to ground.

28. The method of claim 22, wherein the source side of the columns of the first and second subsets are set to the high logic level.

29. The method of claim 28, wherein the voltage level on the gate of the drain side select transistors of the first is set to the high logic level, the voltage level on the gate of the drain side select transistors of the second set is set to a value less than or equal to the high logic level, the voltage level on the gate of the source side select transistors of the first set is set to ground, and the voltage level on the gate of the source side select transistors of the second set is initially set to a value higher than to the high logic level and lowered to the high logic level concurrently with said setting voltage levels on the word lines.

30. The method of claim 29, wherein the voltage level on the drain side of the bit lines in the second subset is set the same value as the gate of the drain side select transistors of the second set.

31. The method of claim 22, wherein the voltage level on the drain side of a second bit line in the first of the subsets is set to the high logic level.

32. The method of claim 22, further comprising:
concurrently erasing the first and second subsets prior to said setting the voltages on the drain side of bit line in the first subset and on the gates of the first and second select transistors in said first and second subsets.

* * * * *